US011581858B2

(12) United States Patent
Ho et al.

(10) Patent No.: US 11,581,858 B2
(45) Date of Patent: Feb. 14, 2023

(54) SAMPLE AND HOLD AMPLIFIER CIRCUIT

(71) Applicant: REALTEK SEMICONDUCTOR CORPORATION, Hsinchu (TW)

(72) Inventors: Chun-Ta Ho, Hsinchu (TW); Shawn Min, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 143 days.

(21) Appl. No.: 17/182,280

(22) Filed: Feb. 23, 2021

(65) Prior Publication Data
US 2021/0265957 A1   Aug. 26, 2021

(30) Foreign Application Priority Data
Feb. 25, 2020   (TW) .................................. 109105994

(51) Int. Cl.
*H03F 1/02*   (2006.01)
*H03F 3/00*   (2006.01)
(Continued)

(52) U.S. Cl.
CPC ............. *H03F 3/005* (2013.01); *H03F 1/303* (2013.01); *H03F 3/45475* (2013.01)

(58) Field of Classification Search
CPC ........... H03F 3/005; H03F 2203/45514; H03F 3/45475; H03F 1/303; H03F 3/72;
(Continued)

(56) References Cited

U.S. PATENT DOCUMENTS 7,847,720 B2 * 12/2010 Chou .................... H03M 1/002
                                                341/161
8,604,962 B1   12/2013 Lewyn
(Continued)

FOREIGN PATENT DOCUMENTS

TW           200822531 A     5/2008

OTHER PUBLICATIONS

OA letter of the counterpart TW application (appl. No. 109105994) mailed on May 10, 2015. Summary of the OA letter: 1. Fig. 1A includes an editorial error required to be amended. 2. Claim 1 is rejected as being unpatentable over the disclosure of the cited reference 1 (TW 200822531 A) and reference 2 (U.S. Pat. No. 8,604,962 B1). 3. Claims 2~10 are allowable.

*Primary Examiner* — Khanh V Nguyen
(74) *Attorney, Agent, or Firm* — WPAT, PC

(57) ABSTRACT

The present disclosure discloses a sample and hold amplifier circuit that includes a positive and a negative terminal capacitor arrays, a positive and a negative terminal switch arrays and a differential output circuit. A second terminal of each of bit capacitors in the positive and the negative terminal capacitor arrays are respectively coupled to a positive and a negative output terminal. In a sampling time period, according to a first connection relation, each of the connected bit capacitors is controlled to receive a polarity input voltage to perform a gain modification. In a holding time period, according to a second connection relation, each of the connected bit capacitors is controlled to receive an offset modification voltage to perform an offset modification. A positive and a negative output voltages are generated at the positive and the negative output terminal to be outputted as a pair of differential output signals by the differential output circuit.

10 Claims, 5 Drawing Sheets

(51) Int. Cl.
*H03F 3/45* (2006.01)
*H03F 1/30* (2006.01)

(58) Field of Classification Search
CPC ... H03F 1/0277; H03M 1/1295; H03M 1/468; H03G 1/0088
USPC ...................................................... 330/9, 51
See application file for complete search history.

(56) References Cited

U.S. PATENT DOCUMENTS

| | | | | |
|---|---|---|---|---|
| 9,184,755 | B2* | 11/2015 | Kimura | H03M 1/0607 |
| 9,998,131 | B1* | 6/2018 | Kinyua | H03F 3/45237 |
| 10,312,925 | B1* | 6/2019 | Chen | H03M 1/164 |
| 10,630,308 | B2* | 4/2020 | Wu | H03K 5/24 |
| 10,804,917 | B1* | 10/2020 | Chang | H03M 1/38 |
| 11,041,888 | B2* | 6/2021 | Kimura | G01R 19/16519 |

* cited by examiner

SAMPLE AND HOLD AMPLIFIER CIRCUIT

BACKGROUND OF THE INVENTION

1. Field of the Invention

The present disclosure relates to a sample and hold amplifier circuit.

2. Description of Related Art

Signal processing circuits used to process images having a YPrPb format are required to receive an alternating current (AC) coupling signal. In order to accurately transmit such a signal as a full swing signal to a subsequent circuit, e.g. an analog to digital conversion circuit, the signal needs to be adjusted. If an efficient adjusting mechanism is absent, the subsequent circuit may receive a transmission result having at least one of the positive signal and the negative signal being suppressed and distorted.

SUMMARY OF THE INVENTION

In consideration of the problem of the prior art, an object of the present disclosure is to provide a sample and hold amplifier circuit.

The present disclosure discloses a sample and hold amplifier (SHA) circuit that includes a positive terminal capacitor array, a negative terminal capacitor array, a positive terminal switch array, a negative terminal switch array and a differential output circuit. Each of the positive terminal capacitor array and the negative terminal capacitor array includes a plurality of bit capacitors. Each of the bit capacitors includes a first terminal and a second terminal, such that the second terminal of each of the bit capacitors in the positive negative terminal capacitor array is electrically coupled to a positive output terminal, and the second terminal of each of the bit capacitors in the negative terminal capacitor array is electrically coupled to a negative output terminal. Each of the positive terminal switch array and the negative terminal switch array is configured to, in a sampling time period, control each of the connected bit capacitors to receive a polarity input voltage from the first terminal, to perform a gain modification relative to a common mode input voltage according to a first connection relation determined by a first combination of bits. Each of the positive terminal switch array and the negative terminal switch array is further configured to, in a holding time period, control each of the connected bit capacitors to receive an offset modification voltage from the first terminal, to perform an offset modification relative to the common mode input voltage according to a second connection relation determined by a second combination of bits. Each of the positive terminal switch array and the negative terminal switch array is yet configured to generate a positive output voltage at the positive output terminal and generate a negative output voltage at the negative output terminal. The differential output circuit is configured to output the positive output voltage and the negative output voltage as a pair of differential output signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present disclosure is to provide a sample and hold amplifier circuit to efficiently perform modification on a gain and an offset relative to a common mode input voltage on an input signal, to match an input range of a subsequent circuit.

Figure 1A:
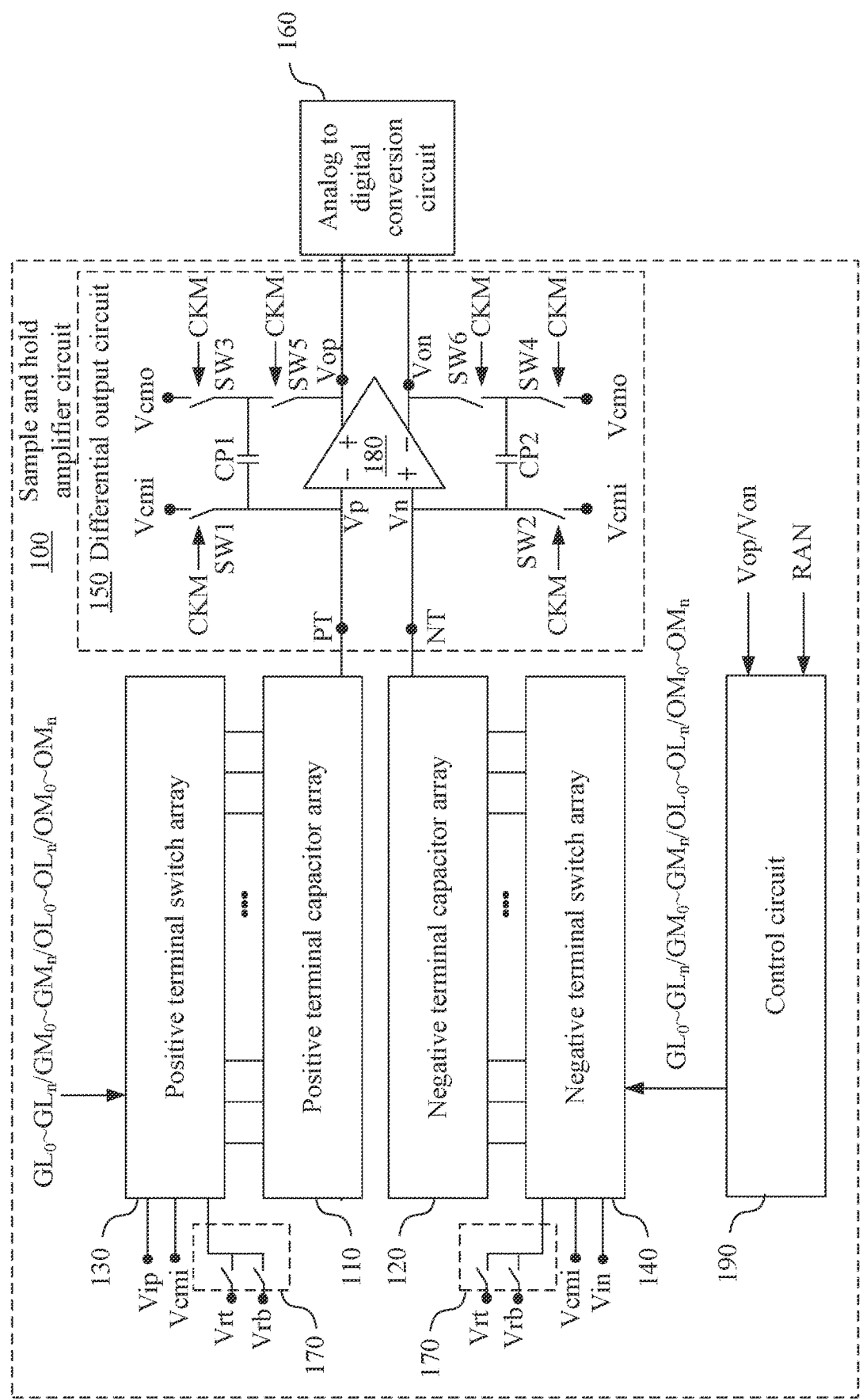
FIG. 1A illustrates a circuit diagram of a sample and hold amplifier circuit and an analog to digital conversion circuit according to an embodiment of the present disclosure.

Reference is now made to FIG. 1A. FIG. 1A illustrates a circuit diagram of a sample and hold amplifier circuit 100 and an analog to digital conversion circuit 160 according to an embodiment of the present disclosure.

In an embodiment, the sample and hold amplifier circuit 100 and the analog to digital conversion circuit 160 can be used in such as, but not limited to a signal processing circuit that processes images having a YPrPb format. The sample and hold amplifier circuit 100 is configured to perform modification on gain and offset of an input analog signal. The input analog signal can thus be enhanced and adjusted relative to a common mode voltage level of the input analog signal to match the input requirement of the analog to digital conversion circuit 160.

The sample and hold amplifier circuit 100 includes a positive terminal capacitor array 110, a negative terminal capacitor array 120, a positive terminal switch array 130, a negative terminal switch array 140 and a differential output circuit 150.

Figure 1B:
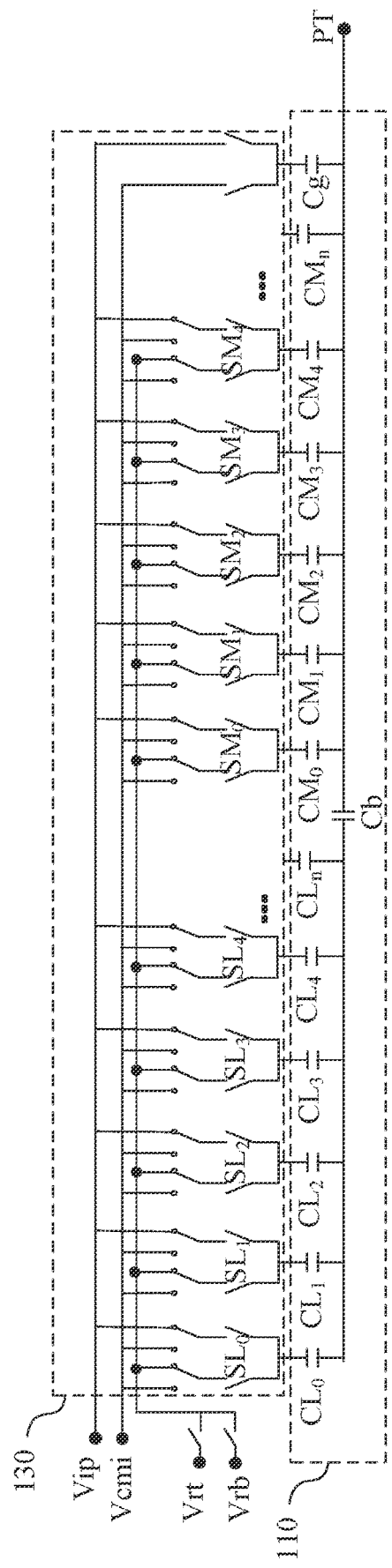
FIG. 1B illustrates a detail diagram of the positive terminal capacitor array and the positive terminal switch array according to an embodiment of the present disclosure.

Reference is now made to FIG. 1B. FIG. 1B illustrates a detail diagram of the positive terminal capacitor array 110 and the positive terminal switch array 130 according to an embodiment of the present disclosure.

The positive terminal capacitor array 110 includes a plurality of bit capacitors $CL_0 \sim CL_n$ and $CM_0 \sim CM_n$ and a gain modification capacitor Cg.

Each of the bit capacitors $CL_0 \sim CL_n$ and $CM_0 - CM_n$ has a first terminal and a second terminal. In an embodiment, the bit capacitors $CL_0 - CL_n$ and $CM_0 - CM_n$ are grouped as a set of higher bit capacitors $CM_0 \sim CM_n$ and a set of lower bit capacitors $CL_0 - CL_n$. The bit capacitor $CM_n$ is the capacitor corresponding to the highest bit, capable to perform a largest amount of modification on gain and offset. On the contrary, the bit capacitor $CL_0$ is the capacitor corresponding to the lowest bit, capable to perform a smallest amount of modification on gain and offset.

In an embodiment, the second terminal of each of the higher bit capacitors $CM_0 - CM_n$ are electrically coupled to the positive output terminal PT. The second terminal of each of the lower bit capacitors $CL_0$–$CL_n$ are electrically coupled together to further electrically coupled to the positive output terminal PT through a middle capacitor Cb.

The gain modification capacitor Cg has a first terminal and a second terminal. The second terminal of the gain modification capacitor Cg is electrically coupled to the positive output terminal PT.

The negative terminal capacitor array 120 has a configuration symmetrical to the positive terminal capacitor array 110, except that the second terminal of each of the bit capacitors $CM_0$–$CM_n$ and $CL_0$–$CL_n$ and the second terminal of the gain modification capacitor Cg are electrically coupled to a negative output terminal NT. As a result, the detail of the configuration of the negative terminal capacitor array 120 is not described herein.

The positive terminal switch array 130 includes a plurality of switch circuits $SL_0$–$SL_n$ and $SM_0$–$SM_n$. The switch circuits $SL_0$–$SL_n$ and $SM_0$–$SM_n$ are disposed corresponding to the bit capacitors $CL_0$–$CL_n$ and $CM_0$–$CM_n$.

Figure 1C:
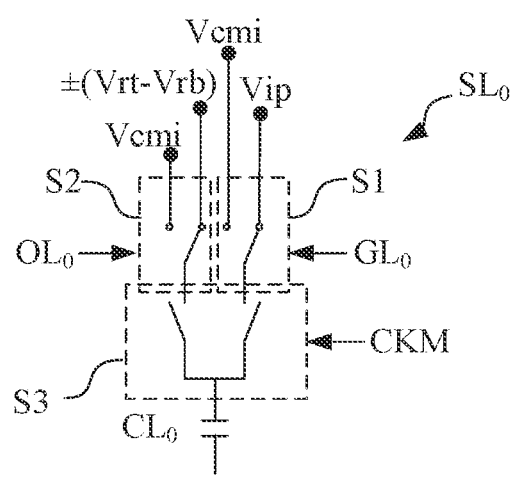
FIG. 1C illustrates an enlarged diagram of the switch circuit and the corresponding bit capacitor according to an embodiment of the present disclosure.

Reference is now made to FIG. 1C. FIG. 1C illustrates an enlarged diagram of the switch circuit $SL_0$ and the corresponding bit capacitor $CL_0$ according to an embodiment of the present disclosure.

Each of the switch circuits $SL_0$–$SL_n$ and $SM_0$–$SM_n$ includes a first selection unit S1, a second selection unit S2 and a third selection unit S3. In an embodiment, the first selection unit S1 of the switch circuits is respectively controlled by gain control signals $GL_0$–$GL_n$ and $GM_0$–$GM_n$. Take the switch circuit $SL_0$ as an example, the first selection unit S1 thereof is controlled by the gain control signals $GL_0$. The second selection unit S2 is controlled by offset control signal $OL_0$–$OL_n$ and $OM_0$–$OM_n$. Take the switch circuit $SL_0$ as an example, the second selection unit S2 thereof is controlled by the offset control signal $OL_0$. The third selection unit S3 is controlled by a mode control signal CKM.

The gain selection unit Sg is disposed corresponding to the gain modification capacitor Cg and is controlled by the mode control signal CKM.

The negative terminal switch array 140 has a configuration symmetrical to the positive terminal switch array 130. The detail of the configuration of the negative terminal switch array 140 is not described herein.

The first selection unit S1, the second selection unit S2, the third selection unit S3 and the gain selection unit Sg operate in a sampling time period and a holding time period in an interlaced manner. The positive terminal switch array 130 including the positive terminal capacitor array 110 having 10 bits of bit capacitors $CM_0$–$CM_4$ and $CL_0$–$CL_4$ and the switch circuits $SM_0$–$SM_4$ and $SL_0$–$SL_4$ corresponding thereto is used as an example to describe the operation thereof.

Figure 2:
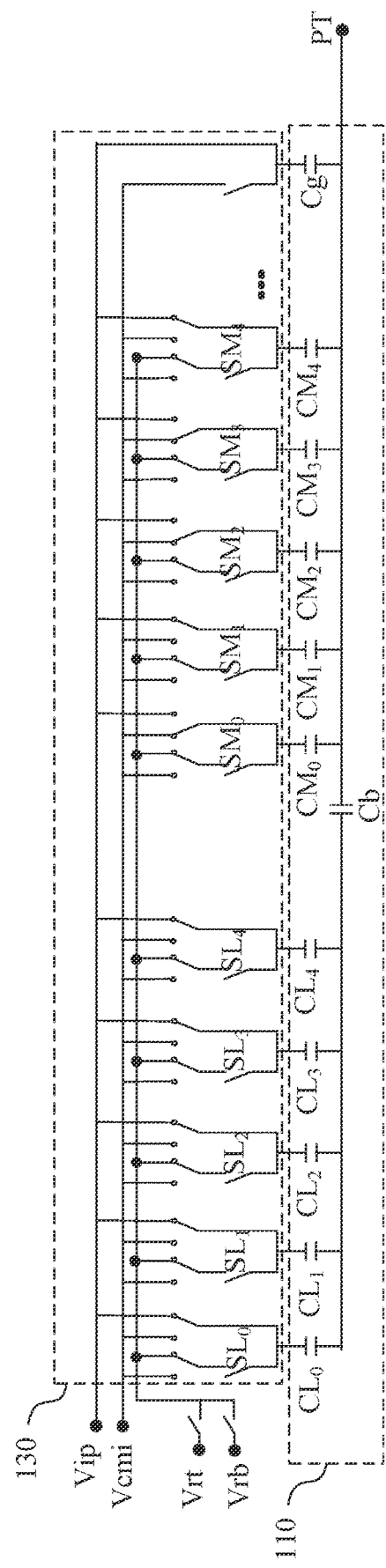
FIG. 2 illustrates a circuit diagram of the positive terminal capacitor array and positive terminal switch array that operate in the sampling time period according to an embodiment of the present disclosure.

Reference is now made to FIG. 2. FIG. 2 illustrates a circuit diagram of the positive terminal capacitor array 110 and positive terminal switch array 130 that operate in the sampling time period according to an embodiment of the present disclosure.

In the sampling time period, the first selection unit S1 is configured to, according to the control of the gain control signals $GL_0$–$GL_n$ and $GM_0$–$GM_n$, receive a polarity input voltage under a selected status or receive a common mode input voltage Vcmi under an unselected status. The polarity input voltage corresponding to the positive terminal switch array 130 is a positive input voltage Vip. The common mode input voltage Vcmi is a direct current voltage.

The third selection unit S3, according to the mode control signal CKM, controls the first selection unit S1 to be electrically coupled to the first terminal of the corresponding capacitors (e.g. the bit capacitors $CM_0$–$CM_4$ and $CL_0$–$CL_4$ corresponding to the switch circuits $SM_0$–$SM_4$ and $SL_0$–$SL_4$).

The gain selection unit Sg, according to the mode control signal CKM, controls the gain modification capacitor Cg to receive the polarity input voltage, which is the positive input voltage Vip.

As a result, under the operation mode in the sampling time period, the sample and hold amplifier circuit 100 can use the first selection unit S1 and the third selection unit S3 included in each of the switch circuits $SM_0$–$SM_4$ and $SL_0$–$SL_4$ in the positive terminal switch array 130, to set a connection relation of the capacitors $CM_0$–$CM_4$ determined by the combination of bits. The gain modification relative to the common mode input voltage Vcmi can be performed on the positive input voltage Vip.

For example, when a desired connection relation of the capacitors is represented as a combination of bits of (1001000100), the first selection unit S1 of the switch circuits $SM_4$, $SM_1$ and $SL_2$ controls the bit capacitors $CM_4$, $CM_1$ and $CL_2$ corresponding to the 10th bit, the 7th bit and the 3rd bit to be the selected status to receive the positive input voltage Vip. The other switch circuits control the other bit capacitors to be the unselected status to receive the common mode input voltage Vcmi.

In an embodiment, when the connection relation of the capacitors $CM_0$–$CM_4$ and $CL_0$–$CL_4$ is represented as the combination of bits of all is (e.g. 10 bits of 1111111111), all the capacitors receive the positive input voltage Vip and have a total gain of 1. When the connection relation of the capacitors $CM_0$–$CM_4$ and $CL_0$–$CL_4$ is represented as the combination of bits of all 0s (e.g. 10 bits of 0000000000), all the capacitors receive the common mode input voltage Vcmi and have a total gain of 0. As a result, according to different combinations of bits from the highest value to the lowest value, $2^{M+N}$ steps of gain modification amounts can be obtained.

Besides, by using the capacitance of the gain modification capacitor Cg, the gain higher than 1 can be performed on the positive input voltage Vip. As a result, when the total required gain is within a range between one time to two times, the capacitance of the gain modification capacitor Cg can generate a gain of 2 on the positive input voltage Vip at first. Subsequently, the connection relation of the bit capacitors $CM_0$–$CM_4$ and $CL_0$–$CL_4$ is used to lower the gain to the desired value.

Identically, the sample and hold amplifier circuit 100 can perform gain modification on the negative input voltage Vin by setting the connection relation of the capacitors determined by the combination of bits of the bit capacitors $CM_0$–$CM_n$ and $CL_0$–$CL_n$ in the negative terminal capacitor array 120. The connection relation of the capacitors can be controlled by the first selection unit S1 and the third selection unit S3 included in each of the switch circuits $SM_0$–$SM_n$ and $SL_0$–$SL_n$ in the negative terminal switch array 140. The detail of the operation is not described herein.

Figure 3:
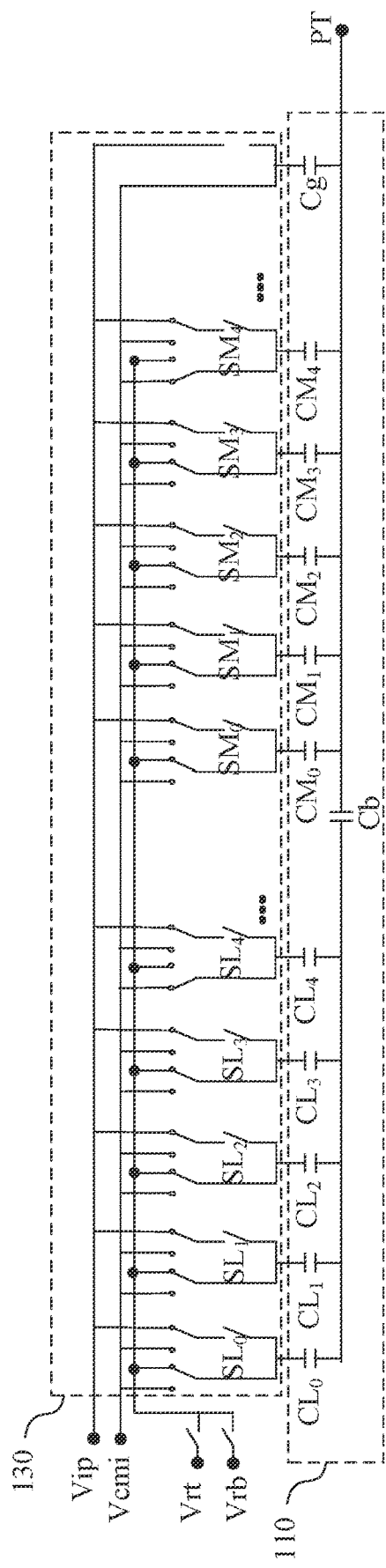
FIG. 3 illustrates a circuit diagram of the positive terminal capacitor array and the positive terminal switch array that operate in the holding time period according to an embodiment of the present disclosure.

Reference is now made to FIG. 3. FIG. 3 illustrates a circuit diagram of the positive terminal capacitor array 110 and the positive terminal switch array 130 that operate in the holding time period according to an embodiment of the present disclosure.

In the holding time period, the second selection unit S2 is configured to, according to the control of the offset control signal $OL_0$–$OL_4$ and $OM_0$–$OM_4$, receive an offset modification voltage under the selected status and receive the common mode input voltage Vcmi under the unselected status. The offset modification voltage is a difference between a first adjusting voltage Vrt and a second adjusting voltage Vrb.

More specifically, in an embodiment, the sample and hold amplifier circuit 100 further includes an adjusting selection unit 170 configured to select different combinations of the first adjusting voltage Vrt and the second adjusting voltage Vrb according to different polarities. When a positive offset modification relative to the common mode input voltage Vcmi is performed, the adjusting selection unit 170 controls the second selection unit S2 to receive a positive adjusting voltage Vrt-Vrb, by subtracting the second adjusting voltage Vrb from the first adjusting voltage Vrt. When a negative offset modification relative to the common mode input voltage Vcmi is performed, the adjusting selection unit 170 controls the second selection unit S2 to receive a negative adjusting voltage Vrb-Vrt, by subtracting the first adjusting voltage Vrt from the second adjusting voltage Vrb.

The third selection unit S3, according to the control of the mode control signal CKM, controls the second selection unit S2 to be electrically coupled to the first terminal of the corresponding capacitors (e.g. the bit capacitors $CM_0 \sim CM_4$ and $CL_0 \sim CL_4$ corresponding to the switch circuits $SM_0 \sim SM_4$ and $SL_0 \sim SL_4$).

The gain selection unit Sg, according to the control of the mode control signal CKM, controls the gain modification capacitor Cg to receive the common mode input voltage Vcmi.

As a result, under the operation mode in the holding time period, the sample and hold amplifier circuit 100 can use the second selection unit S2 and the third selection unit S3 included in each of the switch circuits $SM_0 \sim SM_4$ and $SL_0 \sim SL_4$ in the positive terminal switch array 130, to set a connection relation of the capacitors $CM_0 \sim CM_4$ determined by the combination of bits. The offset modification relative to the common mode input voltage Vcmi can be performed on the positive input voltage Vip.

For example, when a desired connection relation of the capacitors is represented as a combination of bits of (0111101111), the second selection unit S2 of the switch circuits $SM_3 \sim SM_0$ and $SL_3 \sim SL_0$ controls the bit capacitors $CM_3 \sim CM_0$ and $CL_3 \sim CL_0$ corresponding to the 9th~6th bits and the 4th~1st bits to be the selected status to receive the offset modification voltage. The other switch circuits control the other bit capacitors to be the unselected status to receive the common mode input voltage Vcmi.

In an embodiment, when the connection relation of the capacitors $CM_0 \sim CM_4$ and $CL_0 \sim CL_4$ is represented as the combination of bits of all is (e.g. 10 bits of 1111111111), all the capacitors receive the offset modification voltag and have a total offset equal to the value of the offset modification voltage. When the connection relation of the capacitors $CM_0 \sim CM_4$ and $CL_0 \sim CL_4$ is represented as the combination of bits of all 0s (e.g. 10 bits of 0000000000), all the capacitors receive the common mode input voltage Vcmi and have a total offset of 0. As a result, according to different combinations of bits from the highest value to the lowest value, $2^{M+N}$ steps of offset modification amounts can be obtained.

Identically, the sample and hold amplifier circuit 100 can perform offset modification on the negative input voltage Vin by setting the connection relation of the capacitors determined by the combination of bits of the bit capacitors $CM_0 \sim CM_n$ and $CL_0 \sim CL_n$ in the negative terminal capacitor array 120. The connection relation of the capacitors can be controlled by the second selection unit S2 and the third selection unit S3 included in each of the switch circuits $SM_0 \sim SM_n$ and $SL_0 \sim SL_n$ in the negative terminal switch array 140. The detail of the operation is not described herein.

After the gain modification performed in the sampling time period and the offset modification performed in the holding time period, the positive terminal capacitor array 110 and the negative terminal capacitor array 120 generate the positive output voltage Vp and the negative output voltage Vn respectively at the positive output terminal PT and the negative output terminal NT. The positive output terminal PT is electrically coupled to the second terminal of each of the bit capacitors in the positive terminal capacitor array 110. The negative output terminal NT is electrically coupled to the second terminal of each of the bit capacitors in the negative terminal capacitor array 120.

In an embodiment, the differential output circuit 150 includes an amplifier 180, a first coupling capacitor CP1, a second coupling capacitor CP2 and a first switch to a sixth switch SW1~SW6.

The amplifier 180 includes an amplifier positive input terminal (labeled as '+' in FIG. 1A), an amplifier negative input terminal (labeled as '−' in FIG. 1A), an amplifier positive output terminal (labeled as '+' in FIG. 1A) and an amplifier negative output terminal (labeled as '−' in FIG. 1A).

The amplifier positive input terminal is electrically coupled to the negative output terminal NT, to receive the negative output voltage Vn. The amplifier negative input terminal is electrically coupled to positive output terminal PT, to receive the positive output voltage Vp. The amplifier positive output terminal and the amplifier negative output terminal are configured to, according to the positive output voltage Vp and the negative output voltage Vn, output the pair of differential output signals Vop and Von.

Each of the first coupling capacitor CP1 and the second coupling capacitor CP2 includes a first terminal and a second terminal. The first terminal of the first coupling capacitor CP1 is electrically coupled to the amplifier negative input terminal. The first terminal of the second coupling capacitor CP2 is electrically coupled to the amplifier positive input terminal.

As illustrated in FIG. 2, in the sampling time period, each of the first switch SW1 and the second switch SW2 is configured to, according to the control of the mode control signal CKM, control the amplifier positive input terminal and the amplifier negative input terminal to receive the common mode input voltage Vcmi.

Each of the third switch SW3 and the fourth switch SW4 is configured to, according to the control of the mode control signal CKM, control the second terminal of the first coupling capacitor CP1 and the second coupling capacitor CP2 to receive the common mode input voltage Vcmi.

Further, as illustrated in FIG. 3, in the holding time period, each of the fifth switch SW5 and the sixth switch SW6 is configured to, according to the control of the mode control signal CKM, control the second terminal of the first coupling capacitor CP1 to be electrically coupled to the amplifier positive output terminal, and control the second terminal of the second coupling capacitor CP2 to be electrically coupled to the amplifier negative output terminal.

In an embodiment, under the connection relation determined by the combination of bits in the sampling time period, the positive terminal capacitor array 130 and the negative terminal capacitor array 140 have a first equivalent capacitance. The first coupling capacitor CP1 and the second coupling capacitor CP2 respectively have a coupling capacitance. The gain generated by the positive terminal capacitor array 130 and the negative terminal capacitor array 140 is a ratio between the first equivalent capacitance and the coupling capacitance.

Further, under the connection relation determined by the combination of bits in the holding time period, the positive terminal capacitor array 130 and the negative terminal capacitor array 140 have a second equivalent capacitance. The first coupling capacitor CP1 and the second coupling capacitor CP2 respectively have a coupling capacitance. The offset generated by the positive terminal capacitor array 130 and the negative terminal capacitor array 140 is a ratio between the second equivalent capacitance and the coupling capacitance.

More specifically, a difference between the differential output signals Vop and Von can be expressed as the following equation.

$$Vop-Von=(Vip-Vin)\times GA \pm (Vrt-Vrb)\times OFF \quad \text{(equation 1)}$$

The parameters GA and OFF are the gain and the offset respectively. The parameters GA and OFF can be further expressed as the following equations.

$$GA=(CG_{MSB}+(CG_{LSB})/(CT_{LSB}+Cb))/Cf \quad \text{(equation 2)}$$

$$OFF=(CO_{MSB}+(CO_{LSB})/(CT_{LSB}+Cb))/Cf \quad \text{(equation 3)}$$

The parameters $CG_{MSB}$ and $CO_{MSB}$ are the total capacitances of the gain modification capacitor and the higher bit capacitors under a connection relation determined by a combination of bits.

$$CG_{MSB}=Cg+CM_n\times gM_n+CM_{n-1}\times gM_{n-1}+\ldots CM_0\times gM_0 \quad \text{(equation 4)}$$

$$CO_{MSB}=Cg+CMn\times oMn+CM_{n-1}\times oM_{n-1}+\ldots CM_0\times oM_0 \quad \text{(equation 5)}$$

The parameters $CG_{LSB}$ and $CO_{LSB}$ are the total capacitances of the gain modification capacitor and the lower bit capacitors under a connection relation determined by a combination of bits.

$$CG_{LSB}=CL_n\times gL_n+CL_{n-1}\times gL_{n-1}+\ldots CL_0\times gL_0 \quad \text{(equation 6)}$$

$$CO_{LSB}=CL_n\times oL_n+CL_{n-1}\times oL_{n-1}+\ldots CL_0\times oL_0 \quad \text{(equation 7)}$$

Each of the parameters $gM_n$, $gM_{n-1}$, ... $gM_0$ and $gL_n$, $gL_{n-1}$, ... $gL_0$ is a unit gain of each of the bit capacitors. When the bit capacitors are selected to perform gain modification, the corresponding parameters are set to be 1. When the bit capacitors are not selected to perform gain modification, the corresponding parameters are set to be 0. Each of the parameters $oM_n$, $o_{n-1}$, ... $Mo_0$ and $oL_n$, $oL_{n-1}$, ... $oL_0$ is a unit offset of each of the bit capacitors. When the bit capacitors are selected to perform offset modification, the corresponding parameters are set to be 1. When the bit capacitors are not selected to perform offset modification, the corresponding parameters are set to be 0.

The parameter $CT_{LSB}$ is the sum of the capacitances of all the lower bit capacitors.

$$CT_{LSB}=CL_n+CL_{n-1}+\ldots CL_0 \quad \text{(equation 8)}$$

The parameter Cb is the capacitance of the middle capacitor Cb. The parameter Cf is the capacitance of each of the first coupling capacitor CP1 and the second coupling capacitor CP2.

When the value of Cb is C, the value of $CL_n$ is $2^{L_n}C$, the value of $CM_n$ is $2^{M_c}C$, the value of Cf is $2^{L_n+1}C$, the value of Cg/Cf is gc and the parameters $M_n$, $M_{n-1}$, ... $M_0$ and $L_n$, $L_{n-1}$, ... $L_0$ are mapped to be K, K-1, ... 0, equation 2 and equation 3 can be simplified as the following equations.

$$GA=gc+g_K/2^1+g_{K-1}/2^2+g_{k-2}/2^3+\ldots g_0/2^{K+1} \quad \text{(equation 9)}$$

$$OFF=o_K/2^1+o_{K-1}/2^2+o_{k-2}/2^3+\ldots o_0/2^{K+1} \quad \text{(equation 10)}$$

As a result, when the gain GA and the offset OFF described in equation 9 and equation 10 are used to substitute the corresponding parameters in equation 1, the equation 1 becomes the following equation.

$$Vop-Von=(Vip-Vin)\times(gc+g_K/2^1+g_{K-1}/2^2+g_{k-2}/2^3+\ldots g_0/2^{K+1})\pm(Vrt-Vrb)\times(o_K/2^1+o_{K-1}/2^2+o_{k-2}/2^3+\ldots o_0/2^{K+1}) \quad \text{(equation 11)}$$

In an embodiment, the sample and hold amplifier circuit 100 further includes a control circuit 190 configured to determine a difference between the pair of differential output signals Vop and Von and the voltage input range RAN of the analog to digital conversion circuit 160. The control circuit 190 generates the gain control signals $GL_0 \sim GL_n$ and $GM_0 \sim GM_n$ and the offset control signal $OL_0 \sim OL_n$ and $OM_0 \sim OM_n$ according to the difference to perform gain and offset modifications by using a feedback mechanism.

It is appreciated that the embodiments described above are merely an example. In other embodiments, it should be appreciated that many modifications and changes may be made by those of ordinary skill in the art without departing, from the spirit of the disclosure.

In summary, the sample and hold amplifier circuit can efficiently perform modification on a gain and an offset relative to a common mode input voltage on an input signal, to match an input range of a subsequent circuit.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A sample and hold amplifier (SHA) circuit, comprising:
a positive terminal capacitor array and a negative terminal capacitor array each comprising a plurality of bit capacitors, wherein each of the bit capacitors comprises a first terminal and a second terminal, such that the second terminal of each of the bit capacitors in the positive terminal capacitor array is electrically coupled to a positive output terminal, and the second terminal of each of the bit capacitors in the negative terminal capacitor array is electrically coupled to a negative output terminal;
a positive terminal switch array and a negative terminal switch array each configured to:
in a sampling time period, control each of the connected bit capacitors to receive a polarity input voltage from the first terminal, to perform a gain modification relative to a common mode input voltage according to a first connection relation determined by a first combination of bits;
in a holding time period, control each of the connected bit capacitors to receive an offset modification voltage from the first terminal, to perform an offset modification relative to the common mode input voltage according to a second connection relation determined by a second combination of bits; and
generate a positive output voltage at the positive output terminal and generate a negative output voltage at the negative output terminal; and
a differential output circuit configured to output the positive output voltage and the negative output voltage as a pair of differential output signals.

2. The sample and hold amplifier circuit of claim 1, wherein each of the positive terminal switch array and the negative terminal switch array comprises a plurality of switch circuits each comprising:
   a first selection unit configured to, in the sampling time period, receive the polarity input voltage under a selected status and receive the common mode input voltage under an unselected status, according to the control of a gain control signal, wherein the polarity input voltage corresponding to the positive terminal switch array is a positive input voltage and the polarity input voltage corresponding to the negative terminal switch array is a negative input voltage;
   a second selection unit configured to, in the holding time period, receive the offset modification voltage under the selected status and receive the common mode input voltage under an unselected status, according to the control of a offset control signal; and
   a third selection unit configured to, in the sampling time period and according to the control of a mode control signal, control the first selection unit to be electrically coupled to the first terminal of a corresponding one of the capacitors, and configure to, in the holding time period and according to the control of the mode control signal, control the second selection unit to be electrically coupled to the first terminal of one corresponding of the capacitors.

3. The sample and hold amplifier circuit of claim 2, wherein each of the positive terminal capacitor array and the negative terminal capacitor array further comprises a gain modification capacitor having a first terminal and a second terminal, wherein the second terminal of the gain modification capacitor of the positive terminal capacitor array is electrically coupled to the positive output terminal, and the second terminal of the gain modification capacitor of the negative terminal capacitor array is electrically coupled to the negative output terminal;
   each of the positive terminal switch array and the negative terminal switch array further comprises a gain selection unit configured to, in the sampling time period, control the gain modification capacitor to receive the polarity input voltage to perform the gain modification relative to the common mode input voltage, and configured to, in the holding time period, control the gain modification capacitor to receive the common mode input voltage;
   wherein a capacitance of the gain modification capacitor generates one time or more than one times of gain of the polarity input voltage.

4. The sample and hold amplifier circuit of claim 2, wherein the differential output circuit is electrically coupled to an analog to digital conversion circuit, and the sample and hold amplifier circuit further comprises a control circuit, configured to determine a difference between the pair of differential output signals relative to a voltage input range of the analog to digital conversion circuit, to generate the gain control signal and the offset control signal according to the difference.

5. The sample and hold amplifier circuit of claim 2, wherein the differential output circuit comprises:
   an amplifier comprising:
      an amplifier positive input terminal electrically coupled to the negative output terminal to receive the negative output voltage;
      an amplifier negative input terminal electrically coupled to the positive output terminal to receive the positive output voltage; and
      an amplifier positive output terminal and an amplifier negative output terminal configure to output the pair of differential output signals according to the positive output voltage and the negative output voltage;
   a first switch and a second switch respectively configured to, in the sampling time period and according to the control of the mode control signal, control the amplifier positive input terminal and the amplifier negative input terminal to receive the common mode input voltage;
   a first coupling capacitor and a second coupling capacitor each having a first terminal and a second terminal, wherein the first terminal of the first coupling capacitor is electrically coupled to the amplifier negative input terminal, and the first terminal of the second coupling capacitor is electrically coupled to the amplifier positive input terminal;
   a third switch and a fourth switch respectively configured to, in the sampling time period and according to the control of the mode control signal, control the second terminal of the first coupling capacitor and the second coupling capacitor to receive a common mode output voltage; and
   a fifth switch and a sixth switch respectively configured to, in the holding time period and according to the control of the mode control signal, control the second terminal of the first coupling capacitor to be electrically coupled to the amplifier positive output terminal and control the second terminal of the second coupling capacitor to be electrically coupled to the amplifier negative output terminal.

6. The sample and hold amplifier circuit of claim 5, wherein under the first connection relation determined by the first combination of bits, the positive terminal capacitor array and the negative terminal capacitor array have a first equivalent capacitance, and under the second connection relation determined by the second combination of bits, the positive terminal capacitor array and the negative terminal capacitor array have a second equivalent capacitance;
   the first coupling capacitor and the second coupling capacitor respectively have a coupling capacitance;
   a gain generated by the positive terminal capacitor array and the negative terminal capacitor array is a first ratio between the first equivalent capacitance and the coupling capacitance, and an offset generated by the positive terminal capacitor array and the negative terminal capacitor array is a second ratio between the second equivalent capacitance and the coupling capacitance.

7. The sample and hold amplifier circuit of claim 1, further comprising an adjusting selection unit configured to, in the holding time period, control the second selection unit to receive a positive adjusting voltage, by subtracting a second adjusting voltage from a first adjusting voltage, as the offset modification voltage, when a positive offset modification relative to the common mode input voltage is performed;
   wherein the adjusting selection unit is further configured to, in the holding time period, control the second selection unit to receive a negative adjusting voltage, by subtracting the first adjusting voltage from the second adjusting voltage, as the offset modification voltage, when a negative offset modification relative to the common mode input voltage is performed.

8. The sample and hold amplifier circuit of claim 1, wherein the bit capacitors comprised in each of the positive terminal capacitor array and the negative terminal capacitor array are grouped as a set of higher bit capacitors and a set of lower bit capacitors;

wherein the second terminal of each of the bit capacitors that belong to the set of higher bit capacitors is directly electrically coupled to the positive output terminal or the negative output terminal, and the second terminal of each of the bit capacitors that belong to the set of lower bit capacitors is electrically coupled to the positive output terminal or the negative output terminal through a middle capacitor.

9. The sample and hold amplifier circuit of claim 1, wherein the number of the bit capacitors is N, to generate $2^N$ steps of gain and offset.

10. The sample and hold amplifier circuit of claim 1, wherein the largest gain generated by the bit capacitors is 1.

* * * * *